United States Patent [19]
Karlsson

[11] Patent Number: 5,654,626
[45] Date of Patent: Aug. 5, 1997

[54] BOOST-CONVERTER WITH LOW LOSSES

[75] Inventor: Bror Mats Karlsson, Huddinge, Sweden

[73] Assignee: Telefonaktiebolaget LM Ericsson, Stockholm, Sweden

[21] Appl. No.: 139,038

[22] Filed: Oct. 21, 1993

[30] Foreign Application Priority Data

Oct. 22, 1992 [SE] Sweden .................. 9203091

[51] Int. Cl.$^6$ ...................... G05F 1/56
[52] U.S. Cl. .................. 323/222; 363/101
[58] Field of Search ................ 323/222, 290, 323/220; 363/101

[56] References Cited

U.S. PATENT DOCUMENTS

| | | | |
|---|---|---|---|
| 4,591,966 | 5/1986 | Smith | 363/91 |
| 5,059,887 | 10/1991 | Iida et al. | 323/222 |
| 5,067,066 | 11/1991 | Chida | 363/16 |
| 5,164,656 | 11/1992 | Gulczynski | 323/222 |
| 5,247,239 | 9/1993 | Yamamura et al. | 323/272 |
| 5,262,930 | 11/1993 | Hua et al. | 363/21 |

FOREIGN PATENT DOCUMENTS 351 144  1/1990  European Pat. Off. .

*Primary Examiner*—Peter S. Wong
*Assistant Examiner*—Adolf Berhane

[57] ABSTRACT

A boost-converter with low losses having a series connection of an energy storing main inductor and a main diode connected between a first input terminal for a first voltage and a first output terminal for a second, higher dc-voltage. The centre point between the components connected in series is, via a controllable switching element, connected to a common second input and output terminal. A control circuit for the switching element is provided to monitor the voltage of the first output terminal of the converter and to control the on and off operation of the switching element. The converter additionally has an auxiliary inductor, connected between the centre point and a terminal on the switching element, in order to limit the reverse current in the main diode when the switching element changes to conducting condition, and a series connection of a zener diode and a first and second diode between the terminal and the output terminal to transfer energy stored in the auxiliary inductor towards the output terminal. Furthermore, a capacitor for temporary storage of energy from the inductor is connected between the centre point and the connecting point between the first and second diodes.

5 Claims, 2 Drawing Sheets

BOOST-CONVERTER WITH LOW LOSSES

BACKGROUND

The present invention relates to a boost-converter with low losses.

So called boost-converters are normally used in order to create a higher second dc-voltage from a generated first voltage, which second voltage is fed to some kind of load. Such a converter normally makes use of a series connection of an energy storing inductor and a diode connected between an input-terminal from the first voltage source and an output-terminal for the second voltage. The centre-point between the series connected components is connected to earth via a switching device as such a transistor. A capacitor can be connected between the input-terminal and earth in order to decouple current ripples on the input and to damp radio interference to the fed power supply system. In addition, an energy storing (filtering) capacitor is connected between the output-terminal and earth. Finally, a control circuit for the switching element is arranged to monitor the output voltage from the converter and to control the switching element so that, for example, the output voltage is kept constant independent of the load and the input voltage for a given period.

A simple boost-converter thus functions in the following manner. When the switching element switches to non-conducting condition, the voltage at the centre point increases to a value which exceeds the input voltage. The diode conducts in the forward direction and current is fed to the load including the capacitor at the output. When the switching element thereafter switches to conducting condition due to a signal from the control circuit, current from the centre point will be conducted to earth via the switching element, whereby the voltage at the centre point falls. The current through the switching element is, in the first instance, composed of a contribution from the input, via the inductance, and a contribution which is in the form of a reverse current through the diode which has not yet been blocked. After a certain delay, the recovery time of the diode, the diode is blocked and the current through, just as with the voltage across, the switching element rapidly decreases.

The reverse current phenomena through the diode is a problem with this type of circuit and creates power losses in both the diode itself and the switching element. Because of strong current spikes, radio interference can also arise.

It is generally desirable to operate the device with a high switch frequency in order to limit the inductance value and the physical size of the inductor. If no measures were taken to restrict the reverse current in the diode, the power losses would however increase with increased frequency and the efficiency of the circuit would accordingly decrease.

Higher output-voltages also accentuate the problem since diodes for higher voltages generally have longer recovery times.

In order to reduce the size of the reverse current, it is previously known to place an inductor between the diode and the centre point.

In American patent U.S. Pat. No. 4 591 966 there is for example shown a connection in a boost-converter in which the reverse current through the diode, and thereby the switching element (the transistor), is restricted using a saturable inductance connected in series with the diode. The circuit also comprises means to bring the inductor to a saturated condition when the transistor is switched off so that low impedance is obtained for the current in the forward direction of the diode. Using this arrangement, a restriction of the reverse current in the diode is achieved and thus the associated power losses in the diode and transistor when the latter is conducting.

A second solution to the same problem is described in European patent application EP-A-351 144 in which, in addition to the saturable inductor in series with the diode, a second inductor element is provided through which the reverse current passes during restriction of said current. Energy stored in the inductor element is used when the transistor interrupts the current path to earth to bring the inductor in series with the diode to a saturated condition in order to conduct the current in the forward direction of the diode. Using this method it is possible to reduce the power losses in the circuit.

SUMMARY

It is an object of the invention to restrict the power losses due to the reverse current through the main diode in a boost-converter and thereby increase the efficiency of the converter. Due to the special design, the converter is also cheap to manufacture, compact and reliable. In addition, it is also possible to operate the converter at higher frequencies.

According to the invention an inductor which can be linear is provided between the centre point and the switching element which, in the following description, is assumed to be a transistor. The inductor must be demagnetized every period so that it can block the reverse current in the subsequent period, which demagnetizing according to the invention is carried out in a simple and effective manner. Demagnetization takes place by means of energy transfer to a condenser which, in turn, is discharged every period towards the output-voltage. In order to overcome certain phenomena which arise and which will be described in the following, a zener diode is also included in the circuit. The inductor is partially demagnetized towards the zener diode.

BRIEF DESCRIPTION OF THE DRAWINGS

Further features, advantages and details of the invention will be described in greater detail in the following detailed description with reference to the attached drawings, in which.

DETAILED DESCRIPTION

Figure 1:
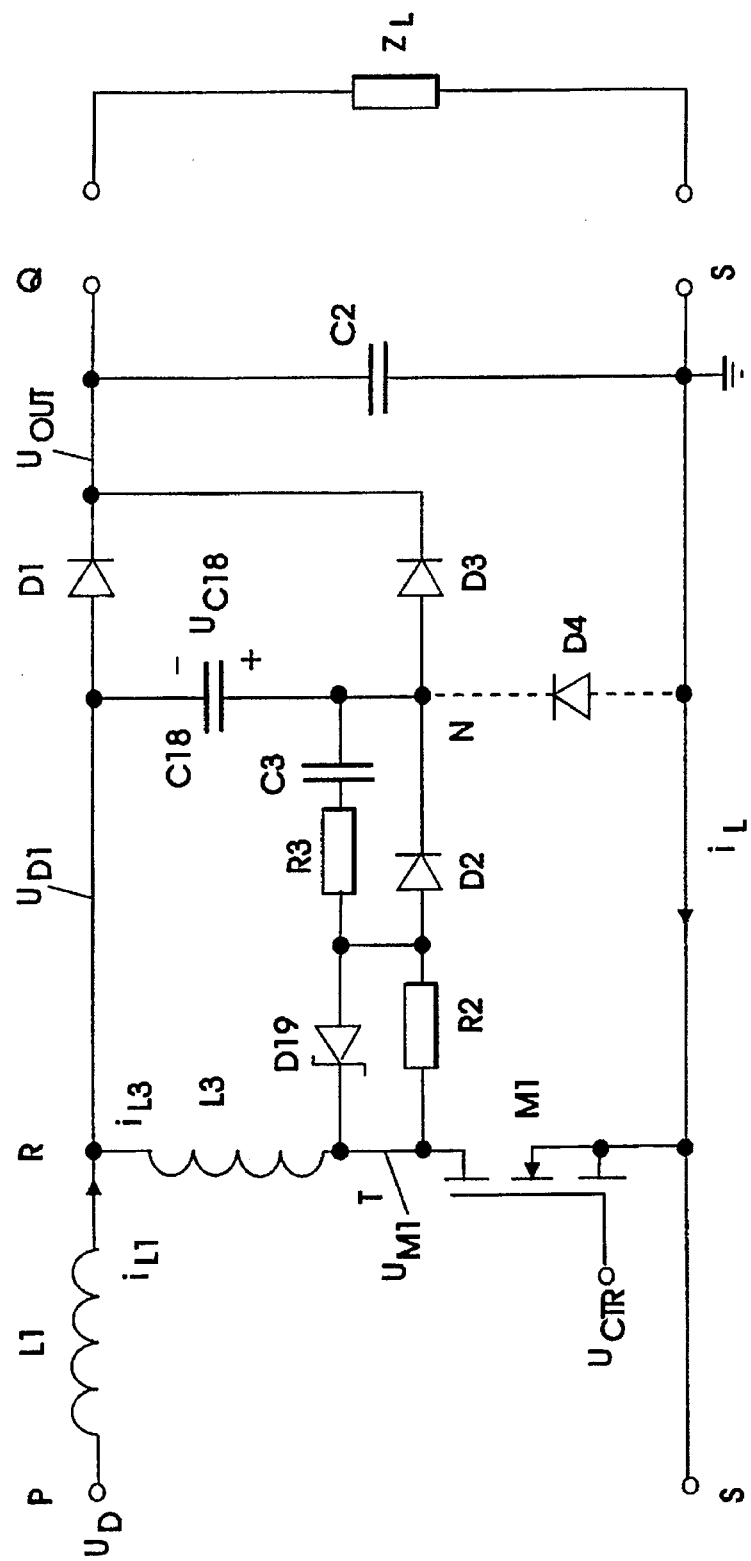
FIG. 1 shows a simplified circuit diagram of the device according to the invention.
Figure 1:
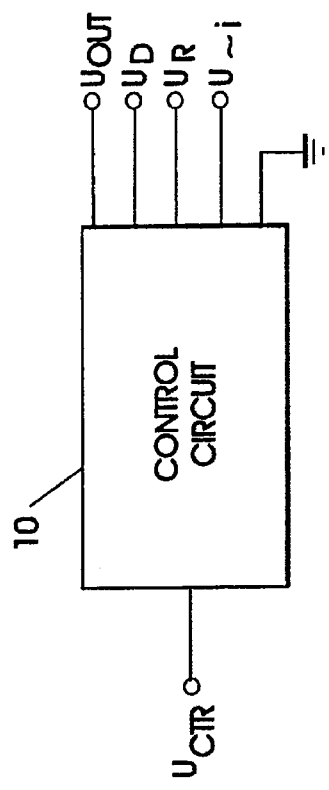

FIG. 1 shows a simplified circuit diagram of the device according to the invention. Only those components which are important for the description of the function of the circuit according to the invention are included. Parts of an actual circuit which are not shown here are, for example, radio-interference-filters, charging circuits for the electrolyte condensers and under voltage protection. How these parts are arranged is evident to the skilled person and thus do not form a part of the present invention, hence they are not hereby included.

An inductor L3 is provided between the centre point and the transistor with the purpose of restricting the first current, i.e. the recovery current, through the diode D1 when the transistor switches to conducting condition. The energy which is thereby stored in the inductance L3 is transferred to a condenser C18 and thereafter to the load. The zener diode D19 absorbs a small portion of the energy from the inductance L3. The diode D4 shown in FIG. 1 with dashed connections is employed in an advantageous embodiment of the invention and is thus assumed in this case not to be connected.

In greater detail, the circuit functions in the following manner. In the initial state the transistor M1 is non-conducting which means that the current through the inductor L3 and the voltage across the condenser C18 are equal to zero. The load current flows through the main inductor L1 and the diode D1 to the load $Z_L$.

In order to control the switching element, a control circuit 10 is provided which, in the embodiment, is in the form of a micro-circuit with the denotation UC3854 from the company Unitrode and is provided with normal peripheral components and voltage supply. Input signals for the control circuit are the voltages $U_{OUT}$, $U_D$, a reference voltage $U_R$ and a voltage which is a function of the current $i_L$ according to FIG. 1. The output voltage, i.e. the control voltage itself, is denoted by $U_{CTR}$.

Figure 2:
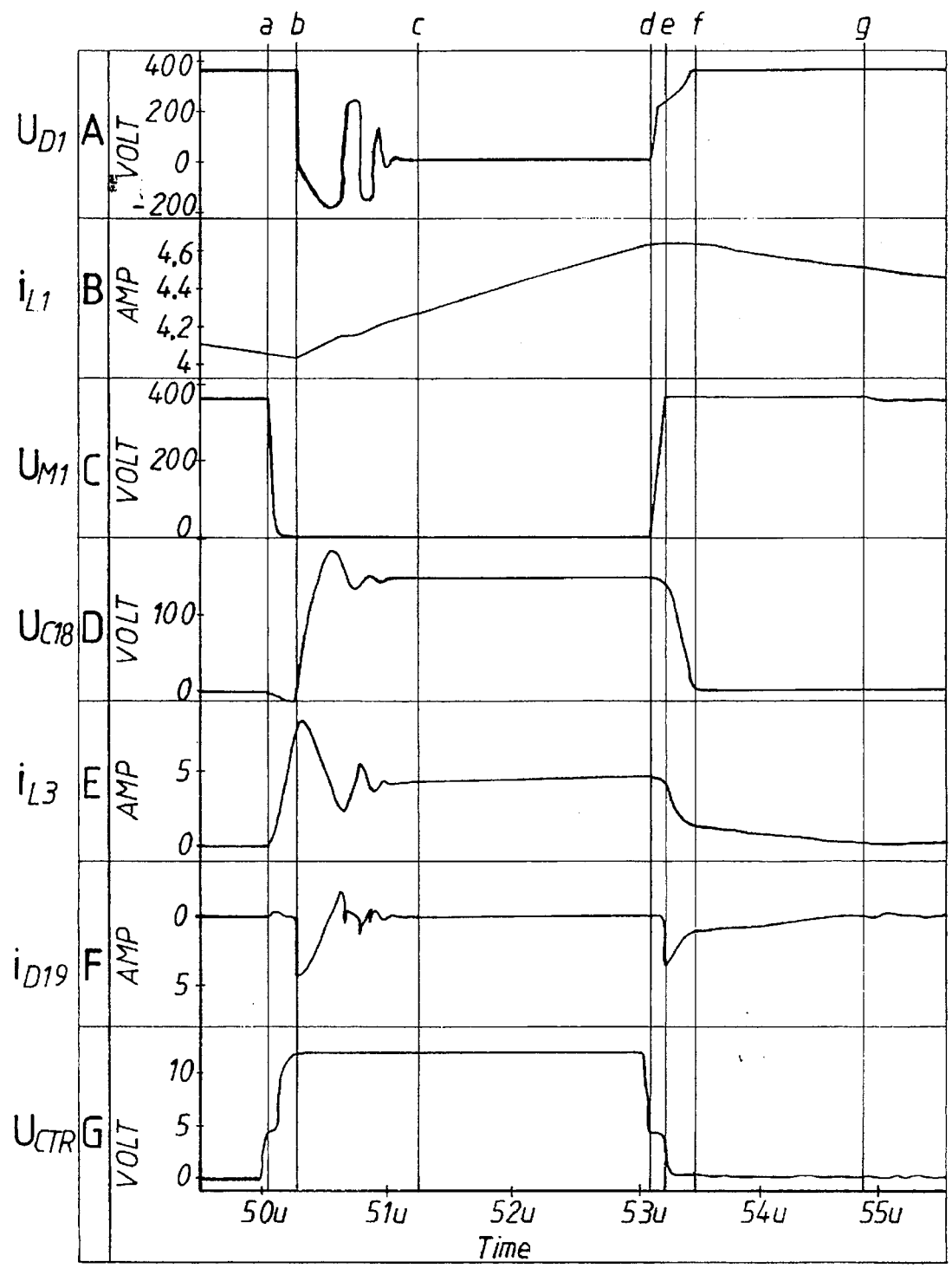
FIGS. 2A–2G show the time variance for currents and voltages at several points in the circuit according to FIG. 1.

By means of the influence of the control voltage $U_{CTR}$, the transistor is switched to conducting condition at the point in time a according to FIG. 2. Since the diode D1 in this state is conducting, the entire output voltage $U_{OUT}$ will be present across the inductor L3, which implies that the current through the inductor L3 increases according to the expression:

$$di/dt = U_{OUT}/L3.$$

The current through D1 in the direction towards the load decreases at the same rate. When the current has dropped to zero it will change direction and a reverse current through the diode arises. The reverse current will flow for a time equal to the recovery time $T_{rr}$ of the diode, whereby the peak value $i_r$ can be expressed as:

$$i_r = di/dt * t_{rr}$$

When the diode D1 blocks in the reverse direction, which occurs at the point in time b according to FIG. 2, the induced voltage across the inductor L3 will drive a current through the circuit consisting of the zener diode D19, the diode D2 and the condenser C18, which is charged to the voltage $U_{c18}$, the value of which is defined by:

$$U_{c18} \approx \sqrt{L3/C18} * i_r$$

In FIG. 2, graph F, the negative current pulse through the zener diode D19 can be seen which transports the energy from the inductor L3 to the condenser C18. A small portion of the energy which is stored in the inductor L3 will obviously form losses in the diodes D19 and D2 which is why the sign "≈" (approximately equal to) has been used in the above equation. By choosing a zener voltage which is very much lower than the final voltage across the condenser C18, the size of the energy loss can be restricted. It is to be noted that the top current through the inductor L3 is the sum of $i_r$ and the current through the inductor L1, i.e. $i_{L1}$.

A resistance R2 is connected in parallel with the zener diode D19 and a series combination of a resistance R3 and a capacitor C3 is connected in parallel with the diode D2. These components serve to dampen resonances which arise in the circuit, e.g. when the diode D2 is switched off.

The point in time c in the graph according to FIG. 2 denotes when the switched on condition of the transistor M1 is terminated and the switch is in a condition (the interval c–d) in which the current through the inductors L1 and L3 increases linearly according to the expression:

$$di/dt = U_D/(L1+L3)$$

Note the different scales in the graphs B and E.

When M1 is switched off, the point in time d in FIG. 2, the current through the inductor L3 will immediately begin to increase the collector voltage $U_{M1}$ on the transistor M1 until it reaches the value $U_{OUT}$, cf. graph C in FIG. 2.

When the collector voltage has reached $U_{out}$ at the point in time e, the diodes D19, D2 and D3 begin to conduct. A second negative current pulse through the zener diode D19 is shown in graph F in FIG. 2. The inductor L3 is now once more demagnetized towards the condenser C18. As can be seen in graph D in FIG. 2, the voltage $U_{c18}$ across the condenser C18 does not however increase, but decreases instead. This is because the current through the inductor L1 discharges the condenser C18 with a greater current than that with which the inductor L3 attempts to charge it up. The energy from the inductor L3 is accordingly transported via the diode D3 to the load at the converter's output according to the principle of the invention.

When the condenser C18 has been discharged, the point in time f in FIG. 2, there remains a small quantity of energy stored in the inductor L3. The demagnetizing can be continued towards the zener voltage and now takes place relatively slowly, cf. the time interval f–g in FIG. 2, graphs E and F.

With lower values of current through L1 and L3, the starting value for the current through L3 will be so small that L3 will be totally demagnetized before the voltage $U_{c18}$ has reduced to zero, which is why the current $i_{L3}$ in the interval f–g in FIG. 2 is zero.

The starting value for the voltage $U_{c18}$ at the point in time d in FIG. 2, i.e. when the transistor M1 is switched off, does not depend on the current through L1, but instead on the output voltage $U_{OUT}$ which is constant, and the recovery time of the diode D1 and the ratio between L3 and C18. This implies that the voltage $U_{c18}$ is always the same when M1 is switched off.

Under certain conditions transistor M1 could be switched on before the inductor L3 has been able to be demagnetized. The diodes D2 and D3 would thus be conducting at the switching on. This implies that a recovery current would flow in the reverse direction through the diodes which may cause them damage. This can be combatted by providing an under voltage protection which, via a filter, monitors the input voltage $U_D$. In the exemplified control circuit, this can be achieved via a voltage divider on pin 10 (enable) of the Unitrode UC3854 circuit.

The condenser C18 and the inductor L3 are now fully discharged of energy and the transistor M1 is switched off. A switching period is complete and the circuit is ready for the next period.

As mentioned previously in relation to FIG. 2 and the graph F, when the transistor switches from both non-conducting to conducting state and conducting to non-conducting state, energy will be transferred from the inductor L3 to the condenser C18 via the diodes D19 and D2. A certain portion of the energy will thus be consumed in the zener diode D19 which negatively affects the efficiency of the converter.

By connecting a diode D4 (see FIG. 1) between the return line S—S and the point N, the energy transfer from the inductor L3 to the condenser C18 when the transistor switches from non-conducting to conducting state will take place via the transistor and the diode D4. Since the voltage drop across the conducting transistor is lower than across the zener diode D19, the energy losses will be reduced, with improved efficiency as a result. The energy transfer between the inductor L3 and the condenser C18 when the transistor switches from conducting to non-conducting state is not affected by the diode D4.

What is claimed is:

1. A boost-converter with low losses comprising:

an energy storing main inductor and a main diode connected in series between a first input terminal for a first voltage and a first output terminal for a second, higher dc-voltage, wherein a center point between the main inductor and main diode is connected to a common second input and output terminal via a controllable switching element;

a control circuit for the controllable switching element, wherein the control circuit monitors the voltage of said first output terminal and controls on and off operation of the controllable switching element;

an auxiliary inductor connected between the center point and a terminal on the controllable switching element in order to limit a reverse current in the main diode when the controllable switching element turns on;

a zener diode and first and second diodes connected in series between the terminal on the controllable switching element and the output terminal for transferring energy stored in the auxiliary inductor towards the output terminal, and a first condenser for temporary storage of energy from the inductor, the first condenser being connected between the center point and a connecting point between the first and second diodes.

2. The boost-converter of claim 1, wherein the auxiliary inductor is linear.

3. The boost-converter of claim 1, wherein a first resistor is connected in parallel with the zener diode, and a series combination of a second resistor and a second condenser is connected in parallel with the first diode.

4. The boost-converter of claim 3, wherein a further diode is connected between the common second input and output terminal and the connecting point between the first and second diodes for transferring energy from the auxiliary inductor to the first condenser.

5. The boost-converter of claim 1, wherein a further diode is connected between the common second input and output terminal and the connecting point between the first and second diodes for transferring energy from the auxiliary inductor to the first condenser.

* * * * *